(12) United States Patent
Feilkas et al.

(10) Patent No.: US 6,816,024 B2
(45) Date of Patent: Nov. 9, 2004

(54) OSCILLATOR CIRCUIT WITH SWITCHABLE COMPENSATED AMPLIFIERS

(75) Inventors: Klaus-Jürgen Feilkas, München (DE); Hans Geltinger, Schliersee (DE); Pedro Jose Moreira, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/718,776

(22) Filed: Nov. 21, 2003

(65) Prior Publication Data

US 2004/0100339 A1 May 27, 2004

Related U.S. Application Data

(63) Continuation of application No. PCT/DE02/01996, filed on May 29, 2002.

(30) Foreign Application Priority Data

May 31, 2001  (DE) .......................................... 101 26 608

(51) Int. Cl.$^7$ ................................................ H03L 5/00
(52) U.S. Cl. ..................................... 331/182; 331/109
(58) Field of Search ................................. 331/182, 109, 331/158, 159, 116 R, 116 FE, 177 V, 117 R

(56) References Cited

U.S. PATENT DOCUMENTS

| | | | | |
|---|---|---|---|---|
| 6,025,757 A | * | 2/2000 | Tsukagoshi et al. | ........ 331/158 |
| 6,064,277 A | * | 5/2000 | Gilbert | .................... 331/117 R |
| 6,081,167 A | | 6/2000 | Kromat | .................... 331/108 C |
| 6,118,348 A | | 9/2000 | Narahara | ............... 331/116 FE |
| 6,133,801 A | | 10/2000 | Tanaka | ........................ 331/158 |
| 6,137,375 A | | 10/2000 | Li | ............................... 331/175 |
| 6,480,071 B1 | * | 11/2002 | Fujii et al. | ..................... 331/74 |
| 2003/0025566 A1 | * | 2/2003 | Rogers | ......................... 331/109 |

FOREIGN PATENT DOCUMENTS

| | | |
|---|---|---|
| DE | 691 26 767 T2 | 6/1992 |
| DE | 198 08 377 A1 | 9/1999 |
| EP | 0 488 394 B1 | 6/1992 |
| JP | 04267607 | 9/1992 |
| JP | 08065048 | 3/1996 |

OTHER PUBLICATIONS

Tietze, U. et al.: "Halbleiter–Schaltungstechnik, Signalgeneratoren", vol. 10, 1993, pp. 458–460 and English Translation of Tietze, U. et al.: "Semiconductor Circuit Technology, Signal Generators", vol. 9, 1991, pp. 409–411.

* cited by examiner

*Primary Examiner*—Robert Pascal
*Assistant Examiner*—Joseph Chang
(74) *Attorney, Agent, or Firm*—Laurence A. Greenberg; Werner H. Stemer; Ralph E. Locher

(57) ABSTRACT

An oscillator circuit is specified, having an LC resonator, to which two or more current paths are connected, which are connected in parallel with one another and can be connected and disconnected individually by switches. The attenuation compensation amplifiers are in this case coupled to the resonant circuit in order to compensate for its attenuation. The oscillator circuit allows the gradient of the compensation for the attenuation of the resonant circuit to be adjusted, without moving the operating point of the amplifiers. This makes it possible to compensate for manufacturing-dependent component tolerances and any amplitude discrepancy caused by them, in a simple way. The oscillator circuit is suitable, for example, for use in voltage-controlled oscillators in order to form phase-locked loops when using mass production technologies.

8 Claims, 3 Drawing Sheets

OSCILLATOR CIRCUIT WITH SWITCHABLE COMPENSATED AMPLIFIERS

CROSS-REFERENCE TO RELATED APPLICATION

This application is a continuation of copending International Application No. PCT/DE02/01996, filed May 29, 2002, which designated the United States and was not published in English.

BACKGROUND OF THE INVENTION

FIELD OF THE INVENTION

Signal generators that can be used to produce sinusoidal oscillations are normally referred to as oscillators. In the case of LC oscillators, the frequency is governed by a resonant circuit with an inductance and a capacitance. The simplest method for producing a sinusoidal oscillation is to use an amplifier to compensate for attenuation of an LC resonant circuit.

The fundamental configuration of an oscillator such as this is described, for example, on pages 458 et seq. of a reference by Tietze, Schenk: entitled "Haibleiter-Schaltungstechnik", 10th Edition 1993.

In order to achieve higher power levels and better efficiencies, oscillators are normally configured in the form of push-pull oscillators, in which two cross-coupled transistors are provided for attenuation compensation, in which case the cross-coupling may, for example, be conductive, capacitive, inductive or transformer positive feedback.

In order to make it possible to produce variable frequencies, it is also normal to configure the integrated capacitance in the LC resonant circuit to be controllable, for example, in the form of a varactor diode.

When oscillator circuits are constructed in the form of integrated circuits, then, with normal manufacturing methods, this necessarily results in process fluctuations that, for example, result in capacitance value tolerances of +/−20%. Discrepancies such as these from the nominal values of the components that are used cause amplitude discrepancies in the output signal from the oscillator, which are undesirable.

It is known for the bias current of the transistors that are provided in the attenuation compensation amplifier, for example MOS field-effect transistors, to be readjusted such that the gradient of the transistors is adapted in a compensating manner. A dependent current source is normally provided for this purpose, although this increases the phase noise of the oscillator. Furthermore, the compensating readjustment of the bias current of the transistors leads to a shift in the operating point, and thus to a poorer drive capability for the transistor.

U.S. Pat. No. 6,118,348 specifies a crystal oscillator circuit. Two or more parallel-connected inverter stages are provided, and are connected to an oscillating crystal on the input side and output side. A control signal generator, which is coupled to the inverter stages, switches between different gain levels. The switching process is carried out with a delay, so that the noise level in the output signal is low.

SUMMARY OF THE INVENTION

It is accordingly an object of the invention to provide a compensated oscillator circuit that overcomes the above-mentioned disadvantages of the prior art devices of this general type, which compensates for manufacturing tolerances from the nominal values of the components used, and discrepancies resulting from these tolerances in the amplitude of the output signal, while the oscillator circuit at the same time has good phase noise characteristics.

With the foregoing and other objects in view there is provided, in accordance with the invention, a compensated oscillator circuit. The compensated oscillator circuit contains a supply potential connection, a resonant circuit, at least two attenuation compensation amplifiers coupled switchably to the resonant circuit to compensate for attenuation, and switches. In each case one of the switches is coupled with in each case one of the attenuation compensation amplifiers for forming switchable current paths between the resonant circuit and the supply potential connection. Currents sources are connected to and feed the attenuation compensation amplifiers. One of the current sources is disposed in each of the switchable current paths.

The attenuation compensation amplifiers which can be switched on and off separately from one another allow both the bias current of the amplifiers and the channel width to channel length ratio of the entire oscillator circuit, and hence the gradient of the gain, to be varied and thus to achieve an oscillator output signal with a constant amplitude despite tolerance-dependent discrepancies in the component values from their nominal values. Since it is not only the bias current of the transistors that is changed, this reduces the dependency of both the supply current and the operating point for the transistors on the actual component values. In this case, the attenuation compensation amplifiers are effectively connected into the oscillator circuit, or are disconnected from it, independently of one another, in order to achieve the desired oscillation amplitude at the output of the circuit, for example, in order to compensate for manufacturing-dependent discrepancies from a desired oscillation amplitude.

The amplitude of the output signal from the oscillator circuit increases as the transistor gradient of the attenuation compensation amplified transistors increases. The gradient is in this case approximately proportional to the square root of the product of the bias current and of the channel width to channel length ratio of the transistors.

Overall, the present invention makes it possible to considerably reduce discrepancies from the ideal operating point of the oscillator amplifier, that is to say of the attenuation compensation amplifier. Thus, overall, this considerably reduces reductions in performance resulting in discrepancies of the components used from their nominal values.

According to the present invention, the current paths each have a current source for feeding the attenuation compensation amplifiers.

By way of example, switchable current sources may be used, which are each provided in one current path with in each case one attenuation compensation amplifier, in which case the attenuation compensation amplifiers may be permanently connected to the common resonant circuit.

In one preferred embodiment of the present invention, the switches each have a control connection, which is connected to a drive circuit.

The drive circuit therefore makes it possible in a simple manner to select a specific combination of attenuation compensation amplifiers, in order in this way to set the desired overall gradient for the attenuation compensation for the oscillator and, in the end, thus to achieve the desired oscillator signal amplitude.

In a further preferred embodiment of the present invention, a control loop is formed, with amplitude value detection, and is connected on the input side to the resonant circuit and on the output side to the drive circuit.

The formation of a control loop allows automatic compensation for manufacturing-dependent component tolerances by measurement of the amplitude and by switching appropriate attenuation compensation amplifiers on and off in a compensating manner.

In a further preferred embodiment of the present invention, the current paths with the attenuation compensation amplifiers are connected in parallel with one another to the resonant circuit.

In a further preferred embodiment of the present invention, the attenuation compensation amplifiers each have two cross-coupled transistors.

When using field-effect transistors, the cross coupling of the transistors can be achieved by connection of in each case one gate connection of a transistor in the transistor pair crossed over to in each case one drain connection of a further transistor in the transistor pair.

The coupling may in this case be directly conductive, capacitive, or by transformer. The source connections of a transistor pair are connected directly to one another at a source node, and are connected to a current source that can be switched on and off. This results in a switchable current path for feeding the attenuation compensation amplifiers.

In a further preferred embodiment of the present invention, the transistors in the attenuation compensation amplifiers are MOSFET transistors, which have the same channel width to channel length ratio in pairs, with the channel width to channel length ratio of the attenuation compensation amplifiers being graduated in binary steps with respect to one another.

The binary graduation of the channel width to channel length ratios that influence the gradient allows a good compensation capability for manufacturing-dependent component tolerances, with a relatively small requirement for components and surface area.

Depending on the field of use for the application of the oscillator circuit, other graduations of the transistor ratios in the attenuation compensation amplifiers with respect to one another may, of course, also be worthwhile.

In a further preferred embodiment of the present invention, the switches are digitally driven transistor switches. Transistor switches based on CMOS or BiCMOS semiconductor technology can be implemented in a simple manner and, furthermore, can be driven easily.

In a further preferred embodiment of the present invention, the resonant circuit has a control input for controlling the oscillation frequency. The resonant circuit is normally in the form of an LC resonant circuit, and in this case the inductance is preferably fixed while the capacitance is controllable, for example, in the form of a varactor that can be driven by a control voltage.

Other features which are considered as characteristic for the invention are set forth in the appended claims.

Although the invention is illustrated and described herein as embodied in a compensated oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
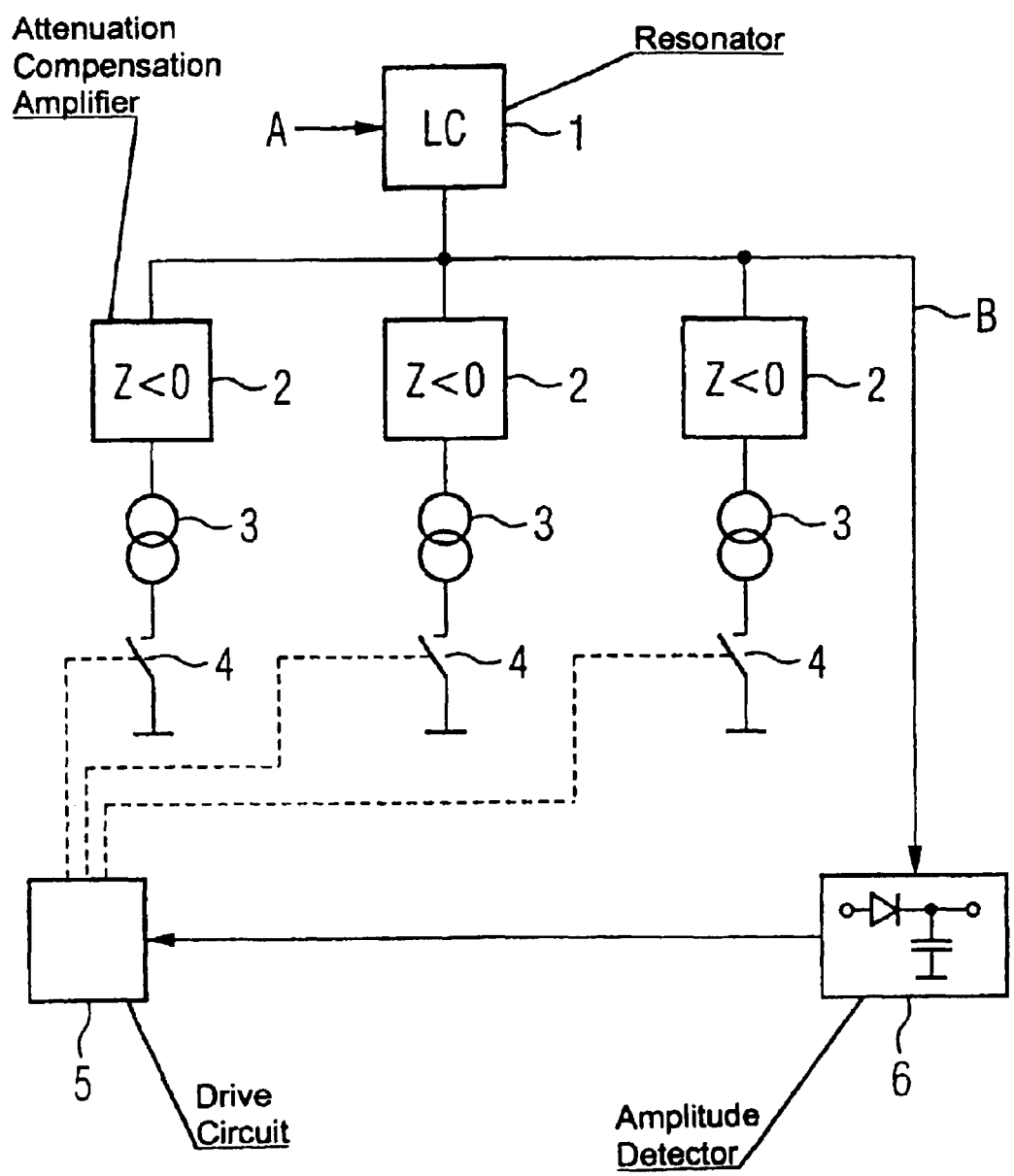
FIG. 1 is a block diagram of a first exemplary embodiment of a compensated oscillator circuit according to the invention.

Referring now to the figures of the drawing in detail and first, particularly, to FIG. 1 thereof, there is shown the principles of a compensated oscillator circuit in the form of a simplified block diagram with an LC resonator 1, to which a control voltage A can be supplied in order to set a desired oscillation frequency. The LC resonator 1 is connected to a reference ground potential via three parallel-connected current paths, each of which has an attenuation compensation amplifier 2, a current source 3 and a switch 4, in each case disposed connected in series. The attenuation compensation amplifiers 2 each have a negative impedance, in order to produce a system which can oscillate.

The switches 4 are connected by their control connections to a common drive circuit 5. The drive circuit 5 accordingly allows any one, two or three current paths to be effectively connected to or disconnected from the resonator 1, in each case independently of one another. The use of switches 4 to interrupt the current paths in each case interrupts the supply of the feed current to the attenuation compensation amplifiers 2.

Furthermore, an amplitude detector 6 is provided in order to provide automatic control, and its input is connected to an output of the oscillator circuit, and it is thus supplied with an oscillator output signal B. The output of the amplitude detector 6 is connected to an input of the drive circuit 5.

Owing to the manufacturing tolerances (which are always unavoidable when using mass production methods) with regard to the component values of the components used, for example capacitances, resistors, etc., discrepancies occur in the signal amplitude at the output oscillator signal B from a nominal amplitude. The discrepancies are evaluated in the drive circuit 5, and the switches 4 in the individual current paths are driven as a function of the discrepancies in the amplitude that is provided from a nominal value, such that the desired nominal amplitude itself, or an amplitude with only a small discrepancy from the nominal amplitude, is set at the output of the oscillator.

The gradient of the overall gain can be adjusted in a desired manner by connecting individual attenuation compensation amplifiers 2. This avoids any shift in the operating point that would result from exclusive adaptation of the bias current of the attenuation compensation amplifiers, and which would lead to a deterioration in the drive capability and in the noise characteristics.

Figure 2:
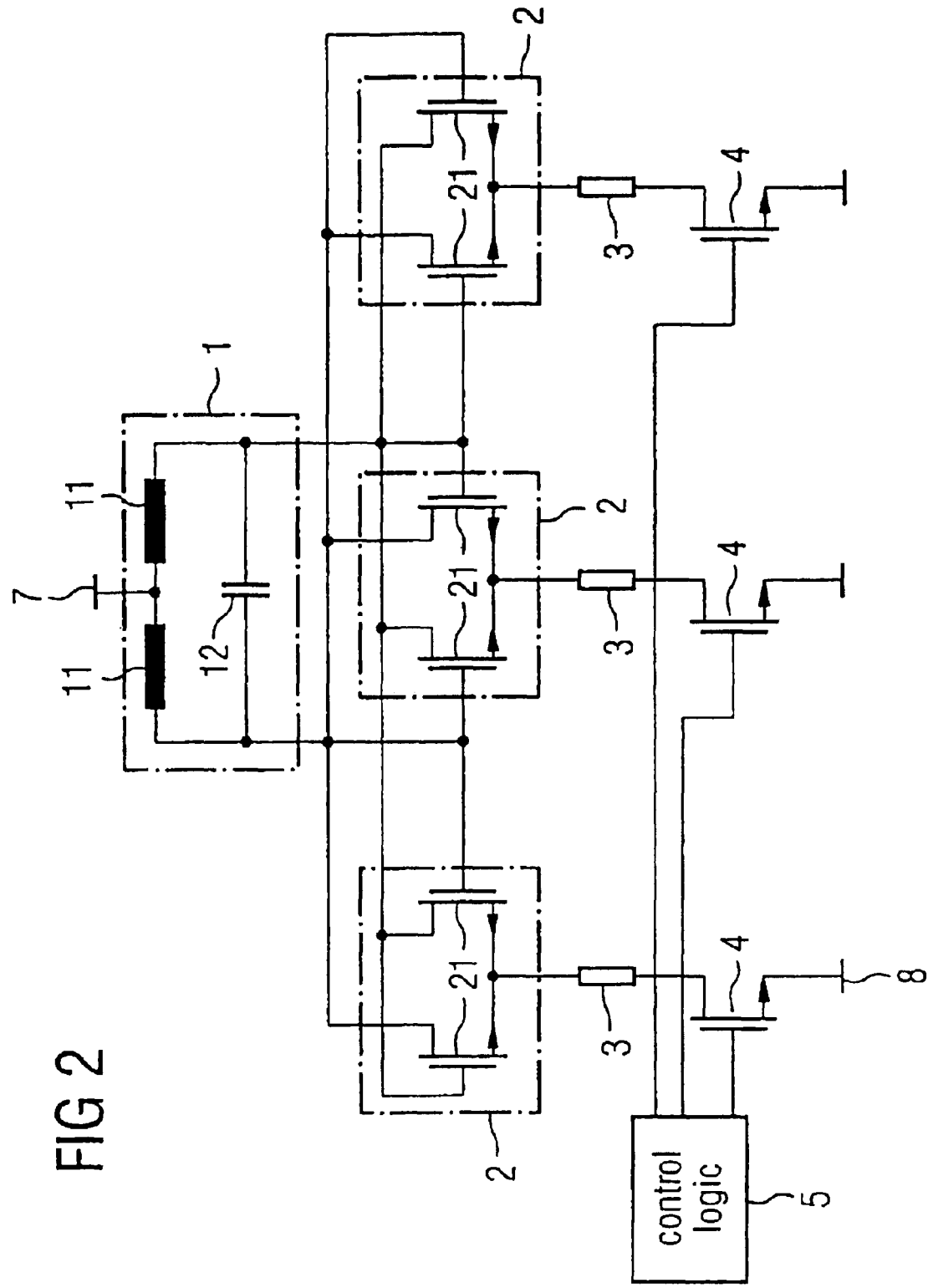
FIG. 2 is a simplified circuit diagram of a second embodiment of the compensated oscillator circuit.

FIG. 2 shows a second exemplary embodiment of a compensated oscillator circuit that, apart from the feedback with the amplitude detector 6 corresponds to the structure shown in the block diagram in FIG. 1, although it is in the form of a push-pull oscillator. For this purpose, the LC resonator 1 is configured to have two inductances 11, one connection of each is connected to a first supply potential connection 7, while a second connection of each is connected to one terminal of a capacitance 12.

The attenuation compensation amplifiers 2 each have two MOSFET transistors 21 which are cross-coupled in pairs, with their source connections being connected directly to one another, while a control connection is in each case connected to one connection of the capacitance 12. Furthermore, the transistors 21 are conductively cross-coupled, by in each case one gate terminal of one of the two transistors being connected to in each case one source terminal of the other transistor in the attenuation compensation amplifier 2. By way of example, a total of three attenuation compensation amplifiers 2 are provided, each of which is connected in the same way in parallel to the LC resonator 1. On the source side, one pair of transistors 21 in each signal path 2, 3, 4 are connected via a current source 3, which is in the form of a resistor, to a drain connection of an MOS field-effect transistor that is operated as a switch 4 and whose source connection is connected to a further supply potential connection 8. The gate connection of the switching transistor 4 is connected to a drive circuit 5.

In order to adjust the amplitude of an output signal from the described oscillator, the current paths 2, 3 and/or 4 can be selectively connected to or disconnected from the drive circuit 5, independently of one another, by appropriately switching the switches 4. In consequence, the gradient of the overall attenuation compensation in the oscillator is adjustable. This is because the connection or disconnection of the feed currents for the attenuation compensation amplifiers 2 makes it possible to adjust the channel width to channel length ratio of the overall attenuation compensation. In the process, the desired optimum operating point of the amplifiers is maintained.

This therefore allows compensation for manufacturing-dependent tolerances and avoidance of any amplitude discrepancy in the output signal from the oscillator using simple circuitry, while the circuit at the same time has good phase noise characteristics.

Figure 3:
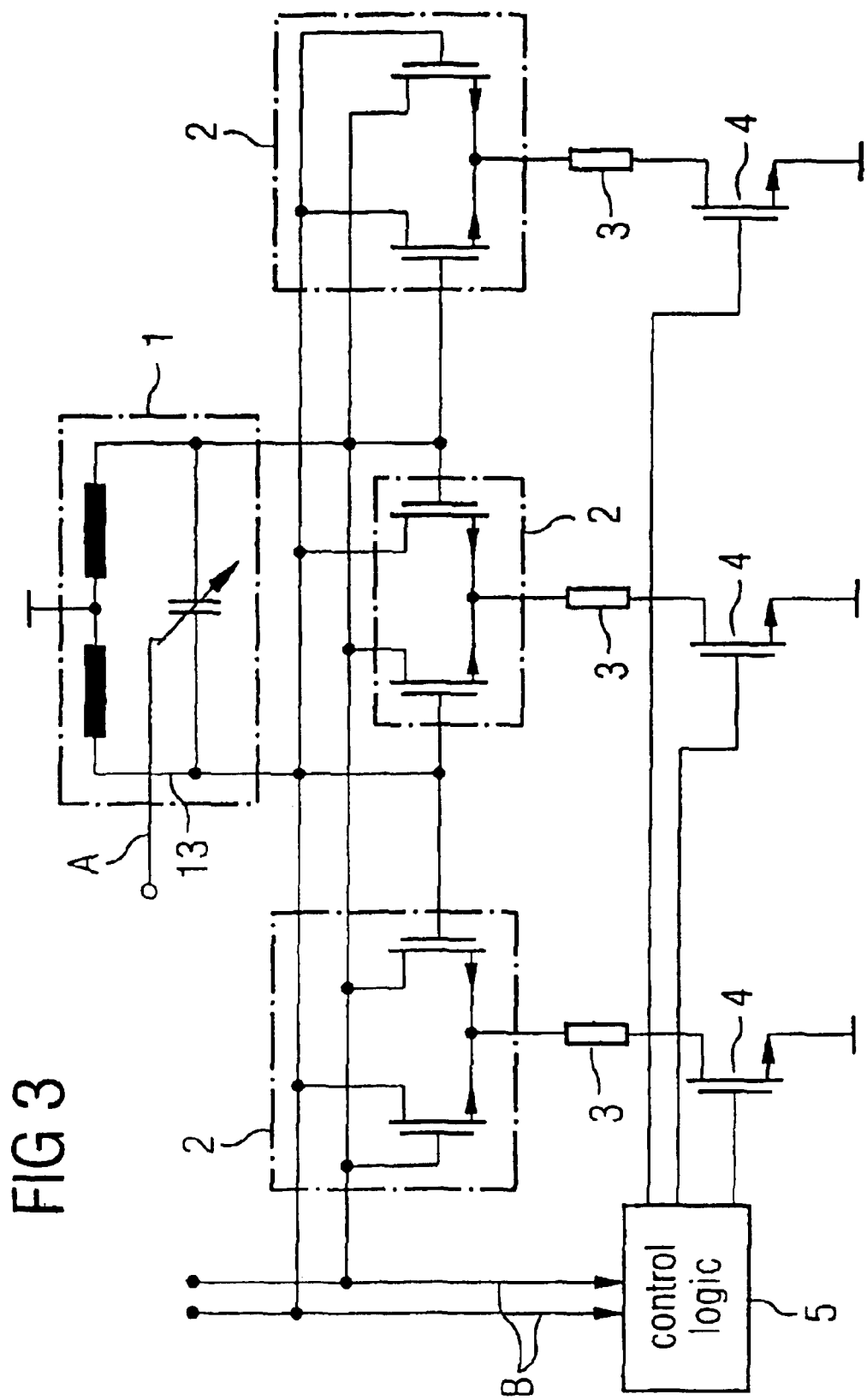
FIG. 3 is a circuit diagram of a third embodiment of the compensated oscillator circuit.

FIG. 3 shows a development of the circuit shown in FIG. 2 as a voltage controlled oscillator. For this purpose, the resonator 1 has a control input for supplying the control voltage A, which can be supplied to a variable capacitance 13 which, on a load side, is connected in the same way as the capacitor 12 shown in FIG. 2. The capacitance value of the capacitor 13 is accordingly dependent on the applied control voltage A. The variable capacitance 13 may, for example, be formed by two varactor diodes.

Furthermore, the controllable oscillator in FIG. 3 has been developed by the oscillator output signal B being fed back to the drive circuit 5 by connecting the balanced output connection of the resonator 1 to the drive circuit 5. This makes it possible to provide automatic compensation for tolerance-dependent changes in the amplitude of the output signal B, by the drive circuit 5 determining any discrepancy between the actual amplitude of the signal B and a nominal amplitude and driving the switches 4 as a function of this discrepancy. The nominal amplitude may, for example, be stored in a memory in the drive circuit 5. As already described with reference to FIGS. 1 and 2, the gradient of the attenuation compensation provided by the oscillator circuit can be adjusted by the switch 4. For this purpose, the switches 4 can be switched on or off separately from one another. The other circuit blocks and components which are shown in FIG. 3, as well as their configuration and function, correspond to what has already been described with reference to FIG. 2, and will therefore not be repeated once again at this point.

Instead of the illustrated conductive cross-coupling of the transistor pairs 21 in the attenuation compensation amplifier 2, it is of course possible to provide a different form of coupling, for example capacitive or transformer coupling. Instead of the resistors, the current sources 3 may also be formed by more complex current sources.

The LC resonator 1 may also have a different structure to that shown, as is normally known in the case of LC varactors.

We claim:

1. A compensated oscillator circuit, comprising:
   a supply potential connection;
   a resonant circuit;
   at least two attenuation compensation amplifiers coupled switchably to said resonant circuit to compensate for attenuation;
   switches, each being coupled with one of said attenuation compensation amplifiers for forming switchable current paths between said resonant circuit and said supply potential connection; and
   currents sources connected to and feeding said attenuation compensation amplifiers, one of said current sources disposed in each of said switchable current paths.

2. The oscillator circuit according to claim 1, further comprising a drive circuit, and said switches each has a control connection connected to said drive circuit.

3. The oscillator circuit according to claim 2, further comprising an amplitude value detector for forming a control loop, said amplitude value detector having an input connected to said resonant circuit and an output connected to said drive circuit.

4. The oscillator, circuit according to claim 1, wherein said switchable current paths with said attenuation compensation amplifiers are connected in parallel with one another to said resonant circuit.

5. The oscillator circuit according to claim 1, wherein said attenuation compensation amplifiers each have two cross-coupled transistors.

6. The oscillator circuit according to claim 5, wherein said transistors in said attenuation compensation amplifiers are field-effect transistors having an equivalent channel width to channel length ratio that in pairs, with the channel width to channel length ratio of said attenuation compensation amplifierS being graduated in binary steps with respect to one another.

7. The oscillator circuit according to claim 1, wherein said switches are digitally driven transistor switches.

8. The oscillator circuit according to claim 1, wherein said resonant circuit has a control input for controlling a resonant frequency using a control voltage.

* * * * *